(12) United States Patent
Van de Walle et al.

(10) Patent No.: US 6,541,292 B2
(45) Date of Patent: Apr. 1, 2003

(54) METHOD FOR FORMING AN ASYMMETRIC NITRIDE LASER DIODE

(75) Inventors: Christian G. Van de Walle, Sunnyvale, CA (US); David P. Bour, Cupertino, CA (US); Michael A. Kneissl, Sunnyvale, CA (US); Linda T. Romano, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/998,335

(22) Filed: Dec. 3, 2001

(65) Prior Publication Data

US 2002/0054745 A1 May 9, 2002

Related U.S. Application Data

(62) Division of application No. 09/388,879, filed on Apr. 9, 1999, now Pat. No. 6,430,202.

(51) Int. Cl.$^7$ ............................................. H01L 21/00
(52) U.S. Cl. ............................ 438/22; 438/47; 438/31
(58) Field of Search ............................ 438/22, 28, 29, 438/31, 32, 34, 35, 46, 47

(56) References Cited

U.S. PATENT DOCUMENTS 5,732,098 A * 3/1998 Nisitani et al. ............... 372/45
5,777,350 A * 7/1998 Nakamura et al. ............ 257/96

* cited by examiner

Primary Examiner—Tuan H. Nguyen
(74) Attorney, Agent, or Firm—Kent M. Chen

(57) ABSTRACT

A structure and method for an asymmetric waveguide nitride laser diode without need of a p-type waveguide is disclosed. The need for a high aluminum tunnel barrier layer in the laser is avoided.

5 Claims, 12 Drawing Sheets

FIG. 7
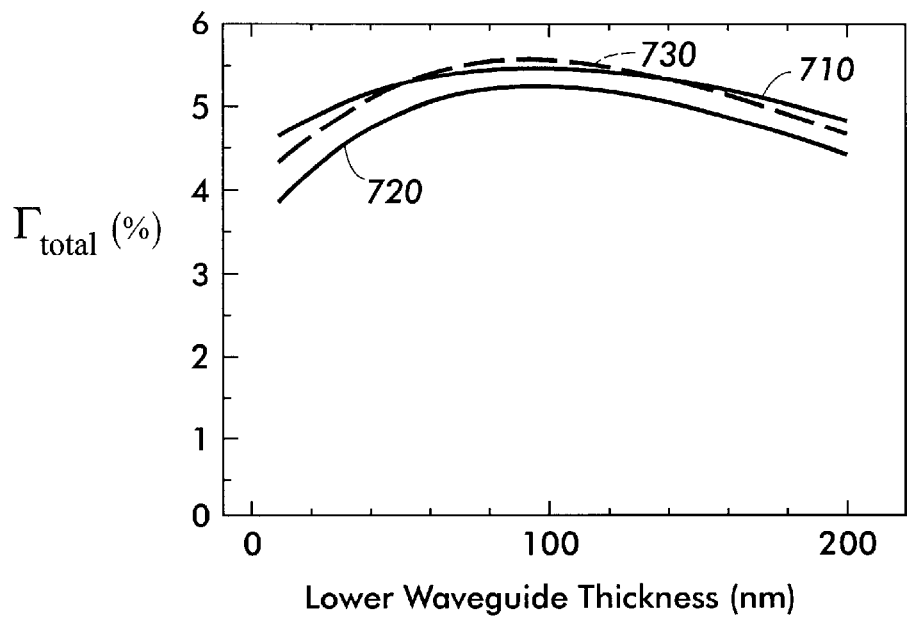
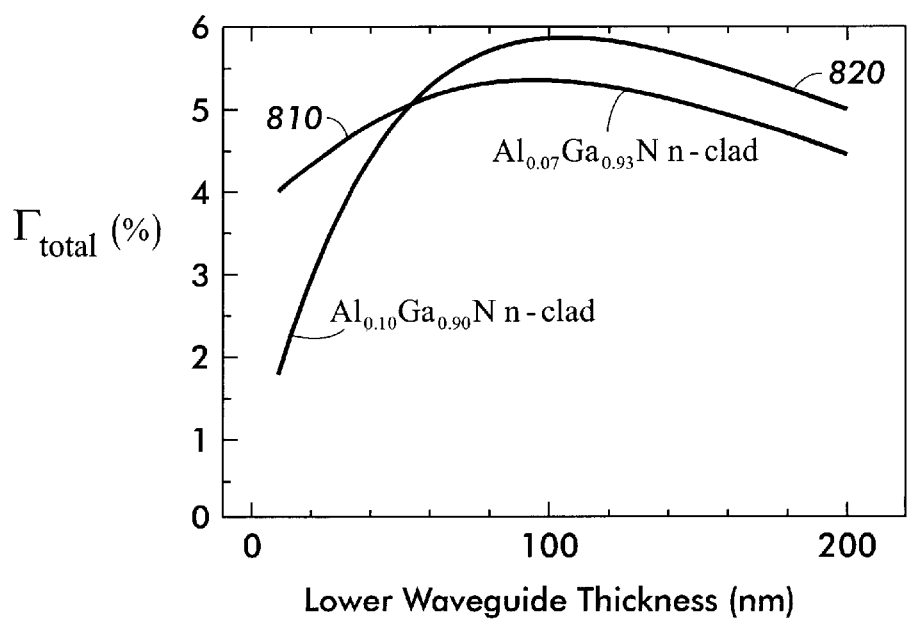
FIG. 8

5 x 2nm GaN / 3nm AlGaN

ENERGY (meV)

Table 1

| LAYER | TIME (sec) | THICKNESS (μm) | TEMPERATURE (°C) | PRESSURE (Torr) | TMGa Flow (μmole/min) | TEGa Flow (μmole/min) | TMIn Flow (μmole/min) | TMAl Flow (μmole/min) | Cp2Mg Flow (μmole/min) | SiH4 Flow (sccm) | NH3 Flow (slpm) | H2 Flow (slpm) |
|---|---|---|---|---|---|---|---|---|---|---|---|---|
| Sapphire Substrate Heat Clean | 600 | | A- or C-face orientation | | 0 | 0 | 0 | 0 | 0 | 0 | 0 | 10 |
| GaN Buffer | 120 | 0.03 | 1050 | 200 | 34 | 0 | 0 | 0 | 0 | 0 | 4 | 10 |
| GaN:un | 1200 | 2 | 550 | 200 | 136 | 0 | 0 | 0 | 0 | 0 | 4 | 10 |
| GaN:Si LCL | 3000 | 5 | 1125 | 700 | 136 | 0 | 0 | 0 | 0 | 0.0002 | 4 | 10 |
| In0.03Ga0.97N:Si DRL | 600 | 0.1 | 1100 | 200 | 0 | 12 | 6 | 0 | 0 | 0.00002 | 5 | 0 |
| Al0.07Ga0.93N:Si Clad | 800 | 0.7 | 800 | 200 | 102 | 0 | 0 | 10 | 0 | 0.0002 | 4 | 10 |
| GaN:Si W/G | 300 | 0.1 | 1100 | 200 | 34 | 0 | 0 | 0 | 0 | 0.00002 | 4 | 10 |
| In0.12Ga0.88N QW | 90 | 0.003 | 1100 | 200 | 0 | 5 | 24 | 0 | 0 | 0 | 5 | 0 |
| In0.02Ga0.98N:Si Barrier | 180 | 0.006 | 775 | 200 | 0 | 5 | 3 | 0 | 0 | 0.00001 | 5 | 0 |
| In0.12Ga0.88N QW | 90 | 0.003 | 775 | 200 | 0 | 5 | 24 | 0 | 0 | 0 | 5 | 0 |
| In0.02Ga0.98N:Si Barrier | 180 | 0.006 | 775 | 200 | 0 | 5 | 3 | 0 | 0 | 0.00001 | 5 | 0 |
| In0.12Ga0.88N QW | 90 | 0.003 | 775 | 200 | 0 | 5 | 24 | 0 | 0 | 0 | 5 | 0 |
| In0.02Ga0.98N:Si Barrier | 180 | 0.006 | 775 | 200 | 0 | 5 | 3 | 0 | 0 | 0.00001 | 5 | 0 |
| In0.12Ga0.88N QW | 90 | 0.003 | 775 | 200 | 0 | 5 | 24 | 0 | 0 | 0 | 5 | 0 |
| In0.02Ga0.98N:Si Barrier | 180 | 0.006 | 775 | 200 | 0 | 5 | 3 | 0 | 0 | 0.00001 | 5 | 0 |
| In0.12Ga0.88N QW | 90 | 0.003 | 775 | 200 | 0 | 5 | 24 | 0 | 0 | 0 | 5 | 0 |
| GaN:un | 150 | 0.005 | 775-900 | 200-700 | 0 | 0 | 0 | 0 | 0 | 0 | 5-4 | 0-10 |
| Al0.07Ga0.93N:Mg Clad | 2400 | 0.5 | 900 | 700 | 34 | 0 | 0 | 12 | 0.5 | 0 | 4 | 10 |
| GaN:Mg Cap | 300 | 0.1 | 900 | 700 | 34 | 0 | 0 | 0 | 0.5 | 0 | 4 | 10 |

FIG. 18A

Table 2

| LAYER | TIME (sec) | THICKNESS (μm) | TEMPERATURE (°C) | PRESSURE (Torr) | TMGa Flow (μmole/min) | TEGa Flow (μmole/min) | TMIn Flow (μmole/min) | TMAl Flow (μmole/min) | Cp2Mg Flow (μmole/min) | NH3 Flow (slpm) | H2 Flow (slpm) |
|---|---|---|---|---|---|---|---|---|---|---|---|
| Structure 910a  GaN:Mg | 6 | 2 | 900 | 700 | 34 | 0 | 0 | 0 | 0.5 | 4 | 10 |
| stop | 5 | 0 | 900 | 700 | 0 | 0 | 0 | 0 | 0 | 4 | 10 |
| Al0.25Ga0.75N:Mg | 6 | 2 | 900 | 700 | 34 | 0 | 0 | 60 | 0.5 | 4 | 10 |
| stop | 5 | 0 | 900 | 700 | 0 | 0 | 0 | 0 | 0 | 4 | 10 |
| Repeat 4 times for 5 periods total | | | | | | | | | | | |
| 910b GaN/AlGaN Structure 1100  GaN:Mg | 6 | 2 | 900 | 700 | 34 | 0 | 0 | 0 | 0.5 | 4 | 10 |
| stop | 5 | 0 | 900 | 700 | 0 | 0 | 0 | 0 | 0 | 4 | 10 |
| Al0.2Ga0.8N:Mg | 9 | 3 | 900 | 700 | 34 | 0 | 0 | 50 | 0.5 | 4 | 10 |
| stop | 5 | 0 | 900 | 700 | 0 | 0 | 0 | 0 | 0 | 4 | 10 |
| Repeat 4 times for 5 periods total | | | | | | | | | | | |
| 910b InGaN/AlGaN Structure 1300  In0.1Ga0.9N | 15 | 1 | 800 | 700 | 0 | 10 | 10 | 0 | 0.2 | 5 | 0 |
| stop | 10 | 0 | 800 | 700 | 0 | 0 | 0 | 0 | 0 | 5-4 | 0-10 |
| Al0.2Ga0.8N:Mg | 9 | 3 | 800 | 700 | 34 | 0 | 0 | 50 | 0.5 | 4 | 10 |
| stop | 5 | 0 | 800 | 700 | 0 | 0 | 0 | 0 | 0 | 4-5 | 10-0 |
| Repeat 4 times for 5 periods total | | | | | | | | | | | |
| 910b InGaN/GaN Structure 1500  In0.1Ga0.9N | 15 | 1 | 800 | 700 | 0 | 10 | 10 | 0 | 0.1 | 5 | 0 |
| stop | 5 | 0 | 800 | 700 | 0 | 0 | 0 | 0 | 0 | 5 | 0 |
| GaN:Mg | 30 | 2 | 800 | 700 | 0 | 10 | 0 | 0 | 0.1 | 5 | 0 |
| stop | 5 | 0 | 800 | 700 | 0 | 0 | 0 | 0 | 0 | 5 | 0 |
| Repeat 4 times for 5 periods total | | | | | | | | | | | |
| Structure 910c  Al0.2Ga0.8N:Mg | 40 | 15 | 900 | 700 | 34 | 0 | 0 | 58 | 0.5 | 4 | 10 |

FIG. 18B

METHOD FOR FORMING AN ASYMMETRIC NITRIDE LASER DIODE

This application is a divisional of application Ser. No. 09/288,879, filed Apr. 9, 1999, now U.S. Pat. No. 6,430,202.

STATEMENT REGARDING FEDERALLY SPONSORED RESEARCH OR DEVELOPMENT

This invention was made with Government support under Agreement No. MDA972-96-3-0014 awarded by DARPA. The Government may have certain rights in the invention.

BACKGROUND

The present invention relates generally to the field of laser diodes, and more particularly to short-wavelength nitride based laser diodes. Short-wavelength nitride based laser diodes provide smaller spot size and a better depth of focus than red and infrared (IR) laser diodes for laser printing operations and other applications. Single-spot nitride laser diodes have applications in areas such as high density-optical storage.

Laser diodes based on higher bandgap semiconductor alloys such as AlGaInN have been developed. Excellent semiconductor laser characteristics have been established in the near-UV to violet spectrum, principally by Nichia Chemical Company of Japan. See for example, S. Nakamura et al., "CW Operation of InGaN/GaN/AlGaN-based laser diodes grown on GaN substrates", Applied Physics Letters, Vol. 72(6), 2014 (1998), S. Nakamura and G. Fasol, "The Blue Laser Diode-GaN based Light Emitters and Lasers", (Springer-Verlag, 1997) and also A. Kuramata et al., "Room-temperature CW operation of InGaN Laser Diodes with a Vertical Conducting Structure on SiC Substrate", Japanese Journal of Applied Physics, Vol. 37, L1373 (1998), all of which are incorporated by reference in their entirety.

For laser diodes and arrays incorporated into printing systems, reliable, low threshold operation is a basic requirement. Among the difficulties associated with achieving low threshold operation is the confinement of injected electrons in the quantum well active region. If the injected electrons are not appropriately confined, the electrons leak away from the quantum well active region and recombine with the holes injected from the p-layers of the structure. For example, in the nitride laser structure pioneered by S. Nakamura of Nichia Chemical Company, a thin, high bandgap layer is placed immediately adjacent to the active region to confine the injected electrons. In the Nakamura structure, a 200 Å layer of $Al_{0.2}Ga_{0.8}N$:Mg acts as a tunnel barrier layer to prevent the energetic electrons (electrons having sufficient energy to escape from the quantum wells) from diffusing into the p-type material, where recombination with the available holes would occur. Reducing electron leakage lowers the laser threshold current and its temperature sensitivity while raising the quantum efficiency of the laser.

FIG. 1 shows conventional nitride laser structure 100. Conventional nitride laser structure 100 uses both GaN:Mg p-waveguide layer 115 and GaN:Si n-waveguide layer 116 with $Al_{0.2}Ga_{0.8}N$:Mg tunnel barrier layer 110 positioned over $In_{0.12}Ga_{0.88}N/In_{0.02}Ga_{0.98}N$:Si multiple quantum well active region 120. $Al_{0.07}Ga_{0.93}N$:Mg p-cladding layer 130 is positioned over p-waveguide layer 115 while $Al_{0.07}Ga_{0.93}N$:Si n-cladding layer 131 is positioned below n-waveguide layer 116. GaN:Mg layer 140 serves as a capping layer to facilitate ohmic contact while $Al_2O_3$ layer 150 serves as the growth substrate. An Ni/Au p-contact (not shown) on top of GaN:Mg layer 140, a Ti/Al contact (not shown) on exposed surface of GaN:Si layer 155. GaN:Si layer 155 is a lateral contact layer while $In_{0.03}Ga_{0.97}N$:Si layer 156 is the defect reduction layer to prevent defect propagation. GaN layer 160 functions as a buffer layer.

FIG. 2 illustrates the function of tunnel barrier layer 110 using a simplified band diagram. Tunnel barrier layer 110 is a p-type AlGaN layer which acts as a strong confinement barrier for injected electrons. Quantum wells 220, 221, 222, 223 and 224 comprising active region 120 are InGaN while tunnel barrier layer 110 is AlGaN. The potential energy level 250 for the conduction band electrons and quasi-fermi level 255 are shown for AlGaN tunnel barrier layer 110 with low p-doping energy level 230 and high p-doping energy level 240 are shown with respect to potential energy level 250 for electrons and fermi level 255 for the conduction band. Quasi-fermi level 260 for the holes is shown along with potential energy level 265 for holes. Successful operation of Nakamura type laser structures requires successful p-type doping of high-bandgap AlGaN tunnel barrier layer 110. However, the growth of tunnel barrier layer 110 presents many practical difficulties, including the difficulty of p-doping high aluminum content alloys and the difficulty of reliably growing high aluminum content alloys because of parasitic pre-reactions between trimethylaluminum and ammonia during metalorganic chemical vapor deposition (MOCVD). If the hole concentration or aluminum content in tunnel barrier layer 110 is insufficient, the ability of layer 110 to contain electrons is reduced since electron confinement increases with the p-type doping level.

P-cladding layer 130 can be used to confine injected electrons in a nitride laser diodes if it is placed in close proximity, typically within 1 minority carrier diffusion length, to the multiple-quantum well active region. A difficulty with this approach is that multiple-quantum well active region 120 is typically located at the core of a waveguide region to maximize the spatial overlap with the optical mode as shown in FIG. 3 for conventional nitride laser diode structure 100. However, this places p-cladding layer more than 1 minority carrier diffusion length from multiple-quantum well region 120. Refractive index profile 310 and corresponding fundamental transverse optical mode 320 are shown as a function of distance relative to the interface between n-cladding layer 131 and n-waveguide layer 116. The waveguide thickness is adjusted independently to maximize the optical confinement factor, ⌈. Optical confinement factor, ⌈ is the fraction of the power that overlaps multiple-quantum well active region 120 where the optical gain is generated. For nitride laser diodes, the typical thickness for the waveguide above and below multiple-quantum well active region 120 is about 100 nm which is greater than 1 electron diffusion length. This places p-cladding layer 130 in conventional nitride laser diode structure 100 to far away from multiple-quantum well active region 120 to confine the injected electrons.

SUMMARY OF INVENTION

In accordance with the present invention, a p-type cladding layer is used to eliminate the p-type waveguide and eliminate the need for a p-type, very high bandgap, high-aluminum content AlGaN tunnel barrier layer in nitride laser diodes. The p-type cladding layer is used to suppress electron leakage. In addition to the p-type cladding layer, a high-Al-content tunnel barrier, a superlattice structure or a distributed electron reflector may be placed at the multiple quantum well region/p-cladding layer interface. Although a p-type cladding layer is used for suppressing electron leakage in laser diodes fabricated from other materials such as arsenides and phosphides, the use of p-cladding layer in nitride laser diodes is not straightforward. The minority carrier diffusion lengths (average distance minority carrier travels before recombination occurs) in nitrides are many times shorter than in other laser diode materials. Hence, the p-cladding layer typically lies several diffusion lengths away from the multiple-quantum well active region. Consequently, injected electrons are not appreciably confined by the p-cladding layer which leads to the requirement for the high-aluminum content tunnel barrier layer. In red and infrared laser diodes, the waveguide thickness is a mere fraction of the diffusion length, so that the cladding layer can effectively suppress leakage, see for example, "Drift leakage current in AlGaInP quantum well laser diodes," D. P. Bour, D. W. Treat, R. L. Thornton, R. S. Geels, and D. F. Welch, IEEE Journal of Quantum Electronics, vol. 29, pp. 1337–1343 (1993).

A high optical confinement factor can still be achieved for nitride laser diode structures if a p-cladding layer is positioned adjacent to the multiple-quantum well active region instead of the typical 100 nm distance away which maximizes the optical confinement factor. This is due to the relatively weak transverse (perpendicular to the layer planes) waveguiding that occurs in nitride lasers which results in much of the mode spreading evanescently into the cladding layers. Indeed, the refractive index difference, $\Delta n$, between the waveguide core and the cladding layers is only about 0.05 which is nearly one order of magnitude less than that in typical AlGaAs lasers. The weak transverse waveguiding results in a less strongly peaked waveguide mode which makes the optical confinement factor less sensitive to any wave guide asymmetry.

A superlattice may be introduced into the asymmetric waveguide nitride laser diode structure or a conventional nitride laser structure to enhance carrier confinement. The superlattice is used to replace a uniform bulk layer. A properly designed superlattice inhibits the tendency for structural defect formation while allowing adequate p-type doping and carrier confinement in the quantum wells. For example, a superlattice that alternates GaN with AlGaN layers allows high p-doping since the GaN layers are readily p-doped. Carrier confinement requires adequate band offsets in the valence and conduction bands between the quantum well active region and the surrounding layers. Carrier confinement by superlattice structures also requires avoiding resonant tunneling effects.

Short period superlattices may be designed to act as coherent electron reflectors. Short period superlattices function as distributed Bragg reflectors which reflect the wavefunction of leaked electrons back into the multiple quantum well active region. Similar structures, often called "Multi-Quantum Barriers" are used to confine electrons in short wavelength ($\lambda<650$ nm) red AlGaNInP lasers where they are placed in the p-cladding layer rather than immediately next to the multiple quantum well active region. As coherent reflections may be produced using low-bandgap superlattice layers, the need for AlGaN layers may be reduced or eliminated. This preserves the structural quality of films while transverse waveguiding is not negatively effected by AlGaN layers and p-type doping benefits from the ability to use low-bandgap barrier layers. The thickness of the layers making up the superlattices needs to be selected to avoid resonant tunneling. Appropriate selection of layer thicknesses allows an electron reflectivity of about 100% for electron energies beyond the classical barrier height. Therefore, properly designed distributed electron reflectors may be more effective than bulk barrier layers for confining injected electrons.

Hence, in accordance with the present invention, nitride laser diode structures can be made which eliminate the need for the p-type waveguide layer and the high-aluminum-content tunnel barrier and have a p-cladding layer deposited above the multiple quantum well active region to confine electrons. Additionally, superlattices may be introduced between the multiple quantum well region and the p-cladding layer to enhance carrier confinement.

BRIEF DESCRIPTION OF THE DRAWINGS

A more complete appreciation of the invention and many of the attendant advantages thereof will be readily obtained and understood by referring to the following detailed description and the accompanying drawings. The drawings, briefly described below, are not to scale.

FIG. 7 shows a comparison between a conventional nitride laser diode and asymmetric waveguide nitride laser diodes in accordance with the invention.

FIG. 8 shows a comparison between the total optical confinement factors of two asymmetric waveguide nitride laser diodes in accordance with the invention.

FIG. 18 shows tables for the parameters and the sequence of layer deposition in accordance with the invention.

DETAILED DESCRIPTION

Figure 4A:
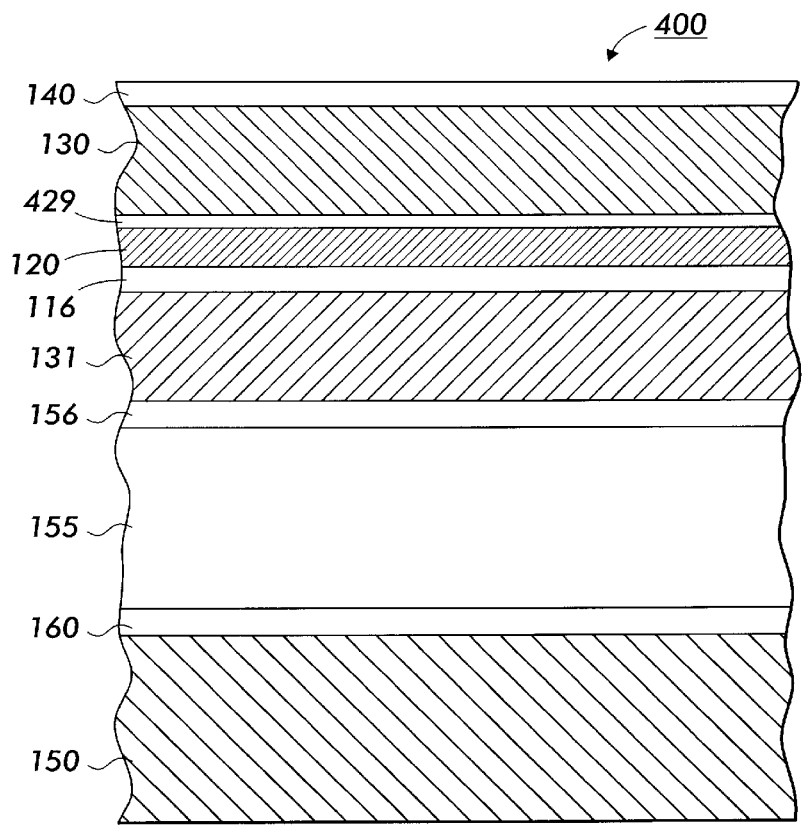
FIG. 4a shows an asymmetric waveguide nitride laser diode structure in accordance with the invention.

In accordance with an embodiment of the present invention, FIG. 4a shows asymmetric waveguide nitride laser diode structure 400 with no p-waveguide layer 115 and no AlGaN tunnel barrier layer 110 over multiple quantum well region 120. P-cladding layer 130 is positioned adjacent multiple quantum well active region 120 with thin undoped GaN layer 429 acting as a transition layer between the two. Substrate 150, may be, for example, composed of $Al_2O_3$ but may be SiC or GaN or other suitable substrate material. Typical values for pulsed threshold current density for laser diode structure 400 are 5 $kA/cm^2$ at 6.5 volts with area dimensions of about 750 $\mu$m by 3 $\mu$m.

Figure 1:
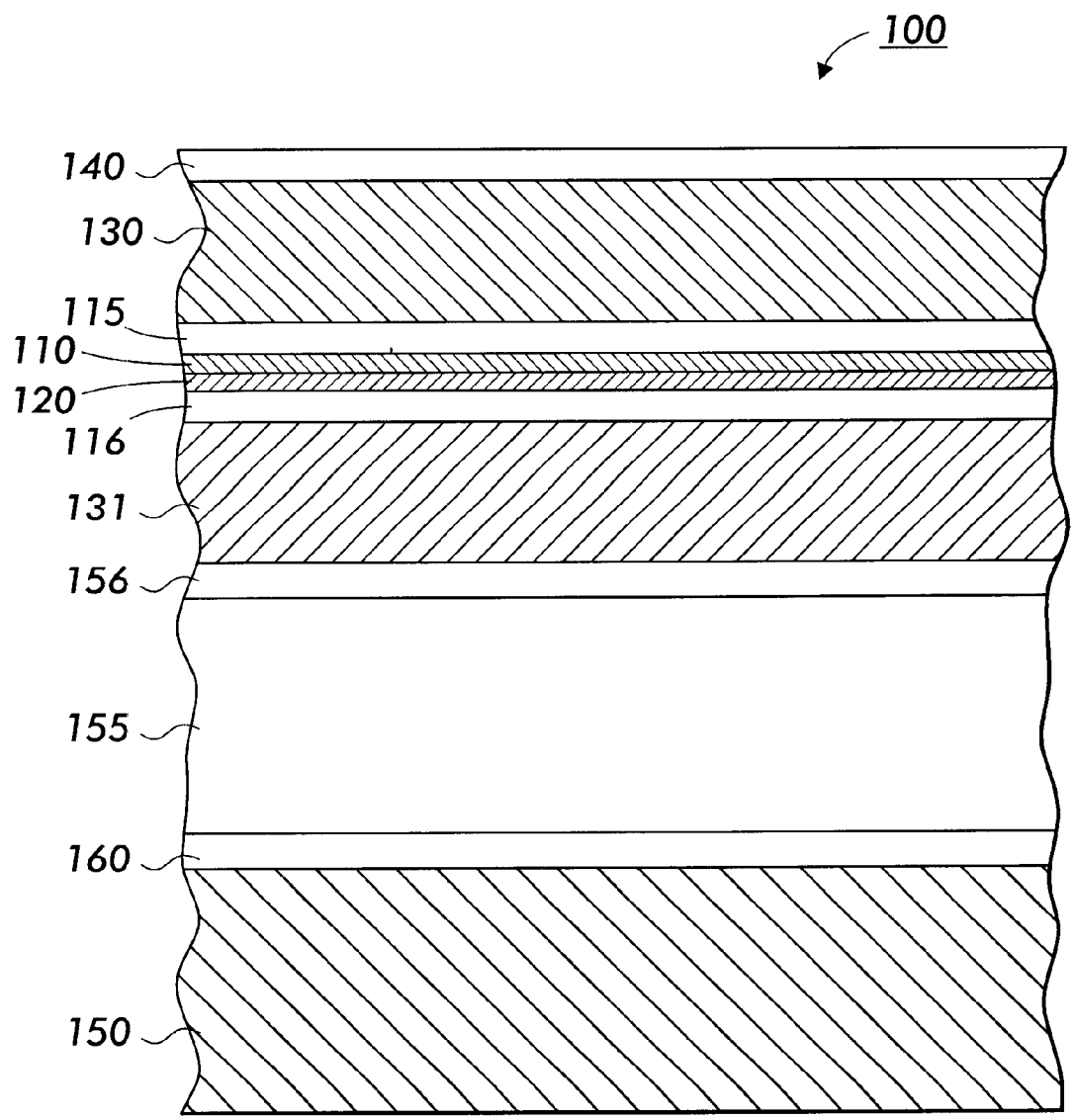
FIG. 1 shows a prior art nitride laser diode structure.
Figure 2:
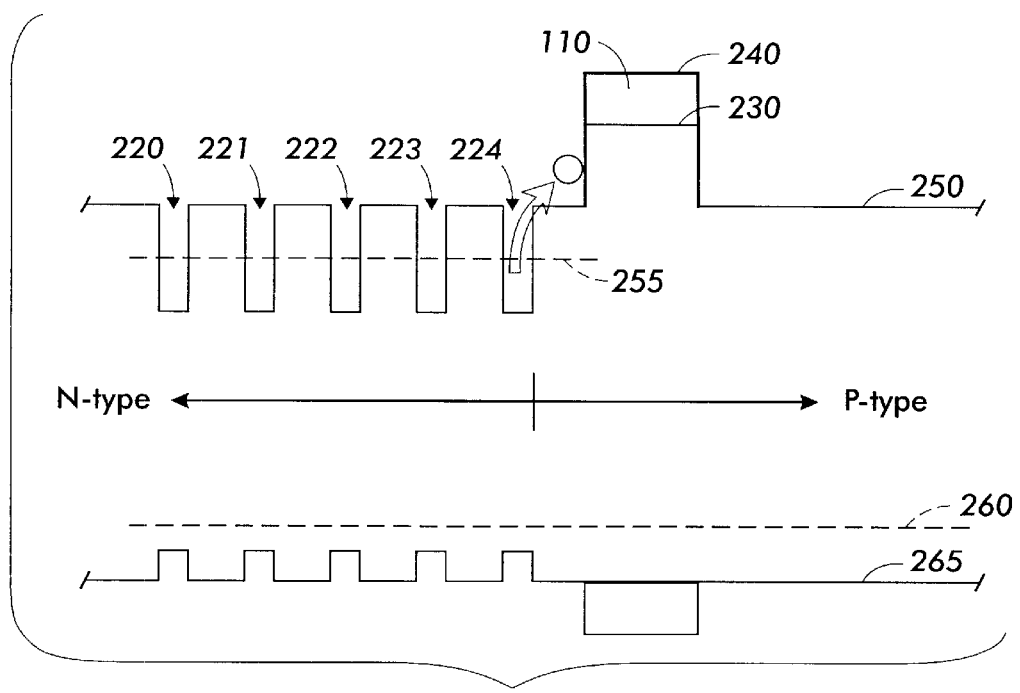
FIG. 2 shows a band diagram for a conventional nitride laser diode structure.
Figure 4B:
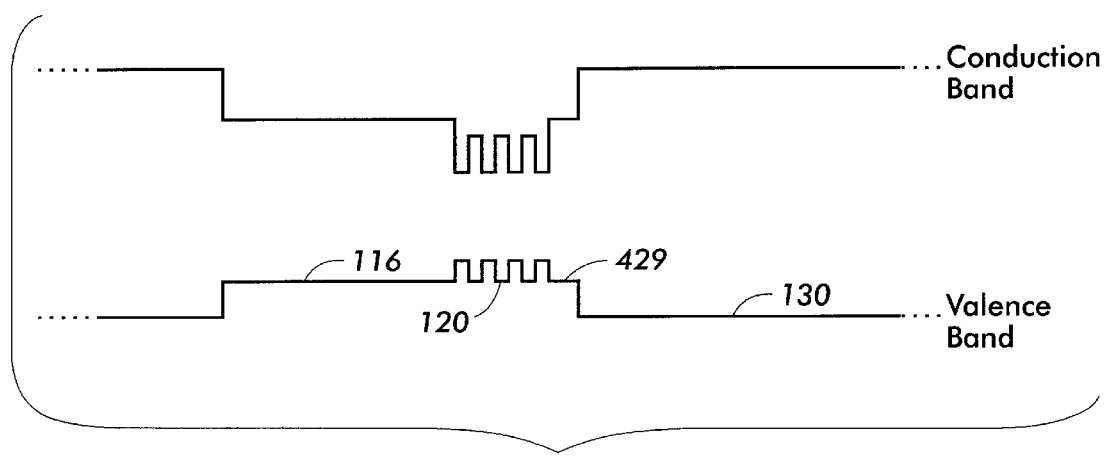
FIG. 4b shows a band diagram for an asymmetric waveguide laser diode structure.

FIG. 4b shows a band diagram of the central region of laser diode structure 400. Note the difference with the band diagram for conventional structure 100 in FIG. 2. In conventional structure 100, p-waveguide layer 115 and tunnel barrier layer 110 are present between multiple-quantum well active region 120 and p-cladding layer 130. The thickness of p-waveguide layer 115 is approximately equal to the thickness of n-waveguide layer 116. In asymmetric waveguide nitride laser diode structure 400, p-waveguide layer 115 is eliminated and p-cladding layer 130 is located close to multiple-quantum well active region 120 with only undoped GaN transition layer 429. In asymmetric structure 400, p-cladding layer 130 functions as both a cladding layer for optical confinement and an electronic confinement barrier for injected electrons.

Figure 3:
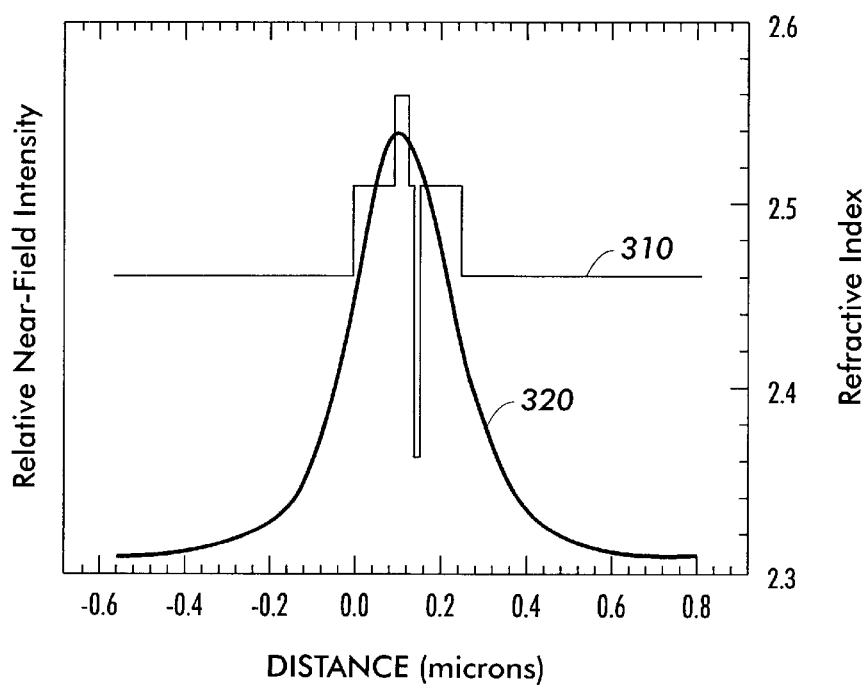
FIG. 3 shows the refractive index profile and corresponding fundamental transverse optical mode for a conventional nitride laser diode.
Figure 5:
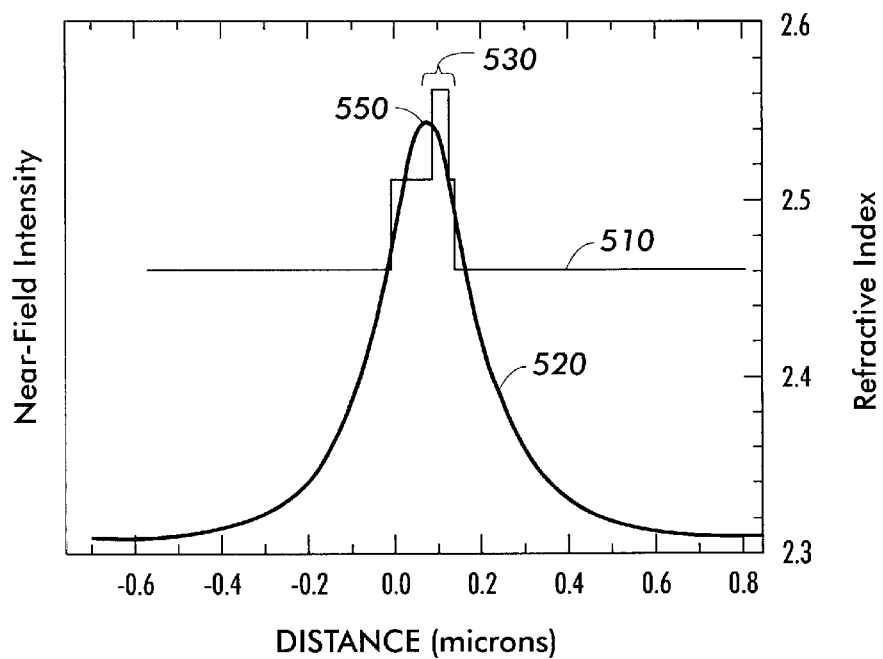
FIG. 5 shows the refractive index profile and corresponding fundamental transverse optical mode for an asymmetric waveguide nitride laser diode in accordance with the invention.
Figure 6:
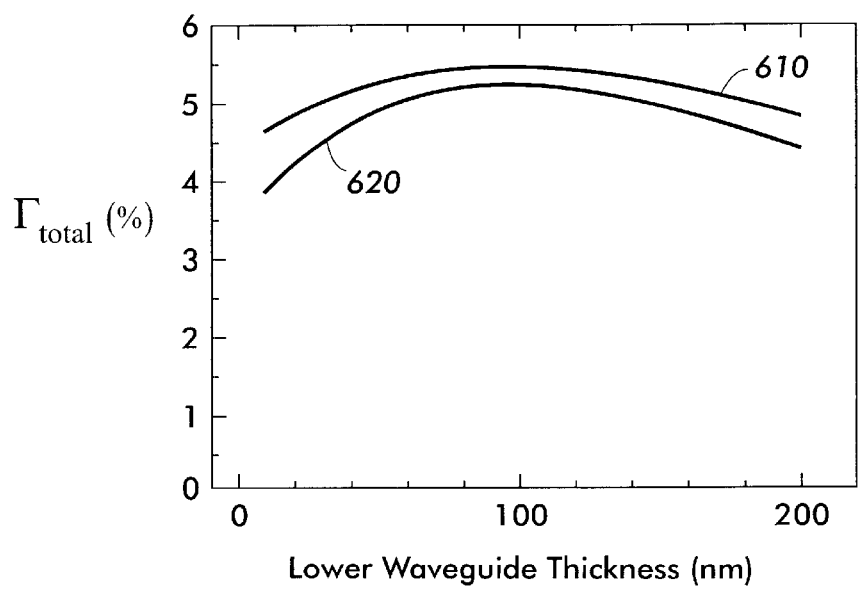
FIG. 6 shows a comparison between a conventional nitride laser diode and an asymmetric waveguide nitride laser diode in accordance with the invention.

FIG. 5 shows modeled refractive index profile 510 and corresponding fundamental transverse optical mode profile 520 for asymmetric waveguide nitride laser diode structure 400 where tunnel barrier layer 110 is eliminated. MODEIG dielectric waveguide simulation software was used for the modeling as in FIG. 3. The software may be downloaded from the web site: www.seas.smu.edu/modeig. FIG. 5 shows that for asymmetric waveguide nitride laser diode structure 400, mode peak 550 is not coincident with multiple quantum well region 120 position 530. In FIG. 6, Curve 610 represents $\Gamma_{total}$ for conventional nitride laser diode structure 100 while curve 620 represents $\Gamma_{total}$ for asymmetric waveguide nitride laser diode structure 400. FIG. 6 shows that the relative displacement of mode peak 550 (see FIG. 5) from multiple-quantum well active region 120 position 530 does not appreciably degrade optical confinement factor $\Gamma$. This is the case because the mode is very weakly confined in the case of nitride laser diodes. $\Gamma_{total}$ values in FIG. 6 represent the sum of the individual $\Gamma$'s for each of five quantum wells in quantum well active region 120 and are plotted versus the thickness of n-waveguide layer 116. Conventional nitride laser structure 100 is taken to have tunnel barrier layer 110 separated from p-cladding layer 130 by 100 nm thick p-waveguide 115. Although $\Gamma_{total}$ is slightly higher for conventional nitride laser structure 100, $\Gamma_{total}$ is nominally still about 5% for both conventional nitride laser structure 100 and asymmetric waveguide nitride laser structure 400.

FIG. 5 shows that a slight displacement of multiple-quantum well active region 120 position 530 toward mode peak 550 and away from p-cladding layer 130 will result in $\Gamma_{total}$ values that are higher. Increased separation between p-cladding layer 130 and multiple-quantum well active region 120 to about 20 nm in asymmetric waveguide nitride laser structure 400 may be accomplished by increasing the thickness of GaN transition layer 429 to achieve an optical confinement factor that is somewhat greater than that achieved in conventional nitride laser structure 100 as seen in FIG. 7 The added portion of GaN transition layer 429 may be p-doped. FIG. 7 compares $\Gamma_{total}$ for conventional nitride laser structure 100 with two embodiments in accordance with the present invention. Curve 710 shows the total optical confinement factor for conventional nitride laser diode structure 100 having 100 nm p-waveguide 115 with 10 nm tunnel barrier layer 110. Calculated curves 720 and 730 show structure 400 with a typical 6 nm and an increased 20 nm separation, respectively, between p-cladding layer 130 and multiple quantum well active region 120. However, increasing the separation between multiple quantum well region 120 and p-cladding layer 130 may significantly reduce the electrical confinement provided by p-cladding layer 130 due to the short minority carrier diffusion length in nitride materials. Hence, the improved optical confinement may be more than offset by the reduced confinement of injected electrons.

In an embodiment in accordance with the present invention, thin (typically about 2–6 nm thickness) undoped GaN layer 429 is inserted between multiple-quantum well region 120 and p-cladding layer 130. GaN layer 429 is deposited at a slow rate (about equal to the rate used for multiple quantum well region 120) while reactor conditions are changed from conditions that are optimal for growth of multiple quantum well region 120 to those of p-cladding layer 130. Undoped GaN layer 429 is a transition layer which accommodates the difference in growth conditions between multiple quantum well active region 120 and 130. Specifically, to incorporate indium (In) into multiple quantum well active region 120 requires a temperature of about 775° C. with no hydrogen carrier gas flow. To achieve better uniformity and allow abrupt gas switching at the interfaces between the individual quantum wells of multiple quantum well active region, a low pressure (about 200 Torr) environment is used. Low pressure growth of the quantum wells also allows the hydrogen carrier gas flows through the organometallic bubbler sources to be minimized. The deposition of p-cladding layer 130 requires considerably different parameters than those for active region 120. High hydrogen carrier gas flows of 10 slpm (standard liters per minute) are required to inhibit pre-reactions between trimethylaluminum and ammonia. Similarly, for p-doping a high pressure (about 700 Torr) and a temperature of 900° C. is used to achieve good quality p-cladding layer 130.

In an embodiment in accordance with the present invention, total optical confinement factor $\Gamma_{total}$ may be increased by increasing the aluminum content of n-cladding layer 131. FIG. 8 shows how total optical confinement factor $\Gamma_{total}$ increases when the composition of n-cladding layer 131 is changed from $Al_{0.07}Ga_{0.93}N$ shown by curve 810 to $Al_{0.10}Ga_{0.90}N$ shown by curve 820. Hence, an asymmetry in the composition of p-cladding layer 130 and n-cladding layer 131 can be used to compensate for the displacement of multiple quantum well active region relative to fundamental transverse optical mode peak 510 to maintain high total optical confinement factor $\Gamma_{total}$.

Figure 9A:
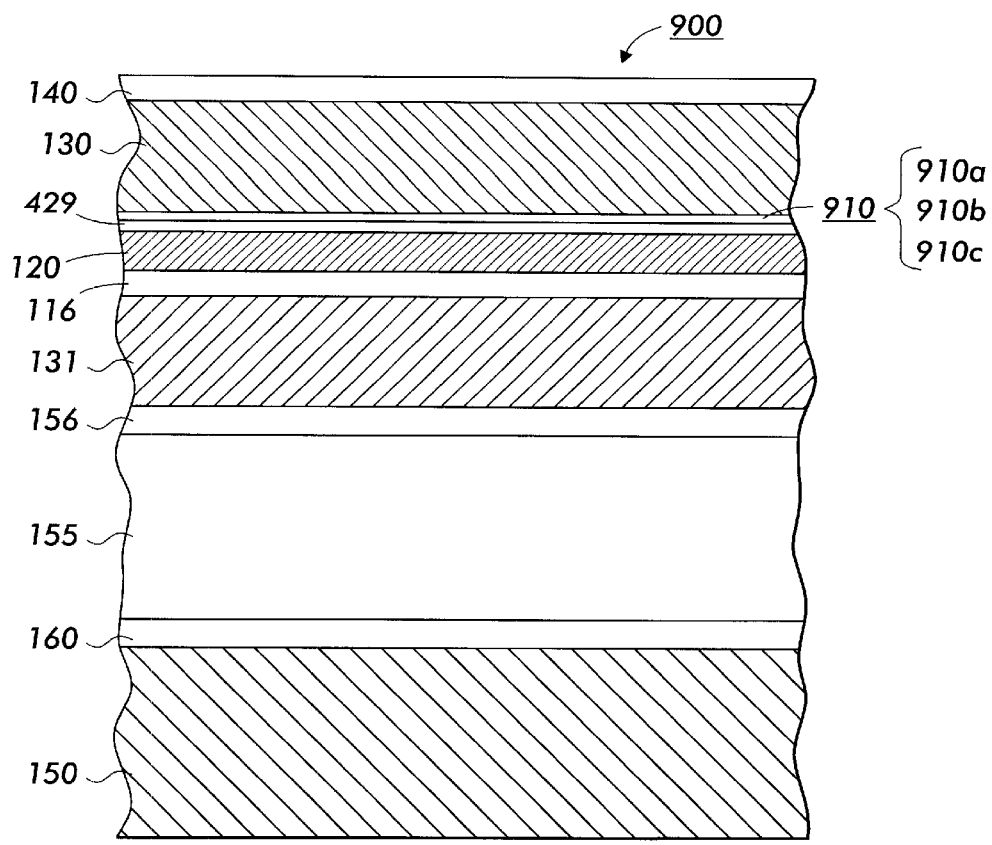
FIG. 9a shows an asymmetric waveguide nitride laser diode structure in accordance with the invention.

FIG. 9a shows modified asymmetric waveguide nitride laser diode structure 900 for providing enhanced electron confinement. Asymmetric waveguide nitride laser diode structure 900 has added layer 910 at the interface between multiple quantum well region 120 and p-cladding layer 130. Added layer 910 may be n-period superlattice 910a, distributed electron reflector 910b or high aluminum content tunnel barrier layer 910c.

Figure 9B:
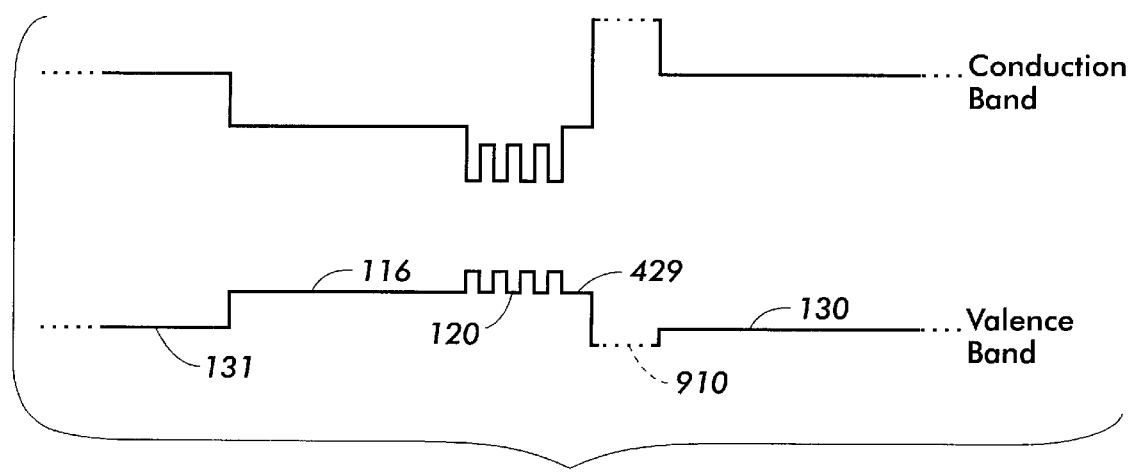
FIG. 9b shows a band diagram fro an asymmetric waveguide laser diode structure in accordance with the invention.

FIG. 9b shows a band diagram of the central region of asymmetric waveguide nitride laser diode structure 900. FIG. 9b is similar to FIG. 4b except for the insertion of added layer 910 which is an additional electronic confinement layer between multiple-quantum well active region 120 and p-cladding layer 130. In FIG. 9b, the band edges in added layer 910 are shown by dotted lines; indeed, layer 910 may comprise an n-period supperlattice.

Figure 10:
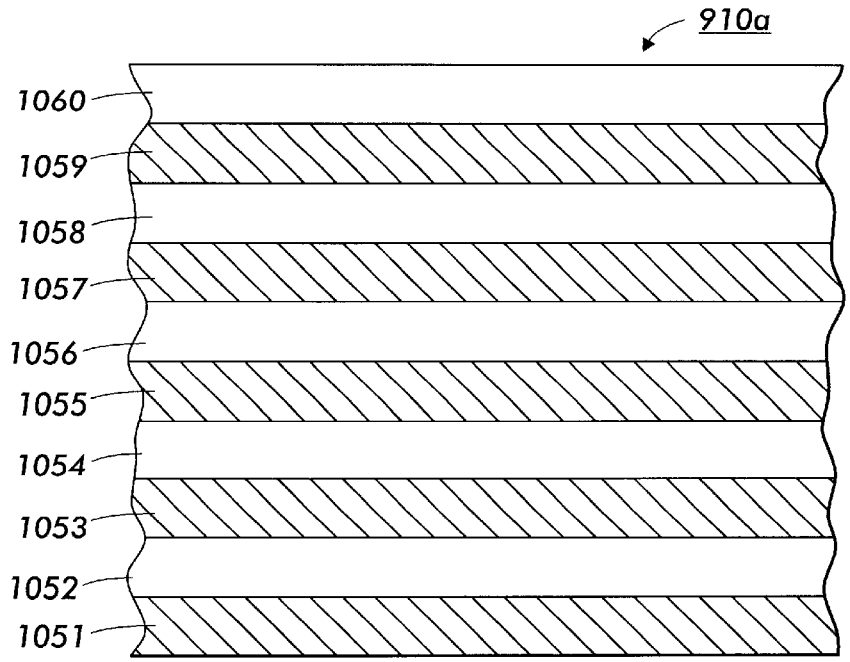
FIG. 10 shows a superlattice structure in accordance with the invention.

FIG. 10 shows 5-period superlattice 910a. Superlattice 910a consists of $Al_{x1}Ga_{1-x1}N$ layers 1051, 1053, 1055, 1057 and 1059 with thickness $d_1$ and $Al_{x2}Ga_{1-x2}N$ layers 1052, 1054, 1056, 1058 and 1060 with thickness $d_2$. A typical choice for superlattice 910a is to choose compositions and thicknesses so that the average composition, $x_{avg}$, in superlattice 910a, defined as equal to $(x1 \cdot d1 + x2 \cdot d2)/(d1+d2)$ is equal to the composition of high aluminum content tunnel barrier layer 910c. A lower value of $x_{avg}$ is sufficient, however, because barrier layers 1052, 1054, 1056, 1058 and 1060 in superlattice 910a will have a band gap larger than the band gap of high aluminum content tunnel barrier layer 910c with composition $x_{avg}$ and quantum confinement in well layers 1051, 1053, 1055, 1057 and 1059 will shift the allowed energies for electrons to higher values. To replace a uniform $Al_{0.2}Ga_{0.8}N$:Mg tunnel barrier layer 910c, superlattice structure 910a could be selected with x1=0 and x2=0.25.

x1 is selected to allow layers 1051, 1053, 1055, 1057 and 1059 to be adequately p-doped which restricts x1 to values below about 0.1, see for example, D. Bremser, W. G. Perry, T. Zheleva, N. V. Edwards, O. H. Nam, N. Parikh, D. E. Aspnes, and R. F. Davis, MRS Internet J. Nitride Semicond. Res. 1, 8 (1996) incorporated by reference in its entirety. A typical value for x1 is to take x1=0, resulting in GaN layers 1051, 1053, 1055, 1057 and 1059. x2 is selected to provide a high enough band gap for superlattice 910a to enable effective electron confinement with a typical value for x2 being x2=0.25 as discussed above. Thicknesses d1 and d2 may range between 0 and about 50 Å, with a typical value being d1=d2=20 Å. A thickness less than about 50 Å is necessary to enable significant overlap of electron wavefunctions between well layers 1051, 1053, 1055, 1057 and 1059 and barrier layers 1052, 1054, 1056, 1058 and 1060. A barrier thickness greater than 10 Å allows adequate control over the growth, with the objective of achieving sharp interfaces and high doping in well layers 1051, 1053, 1055, 1057 and 1059. Based on calculations of wavefunctions, thicknesses d1 and d2 between 10 and 20 Å are optimal. This results in a total thickness for superlattice 910a of between 100 and 200 Å. The lowest allowed energy for electrons in superlattice 910a is at a level between the conduction band in the quantum wells of superlattice 910a and the conduction band in the quantum barriers of superlattice 910a. The lowest allowed energy for electrons increases as the thickness of the well decreases. Use of superlattice 910a also reduces the tendency for structural defect formation and improves the ability to accomplish p-type doping of the tunnel barrier. Superlattice 910a may also be used in place of tunnel barrier layer 110 in conventional nitride laser diode structure 100.

Figure 11:
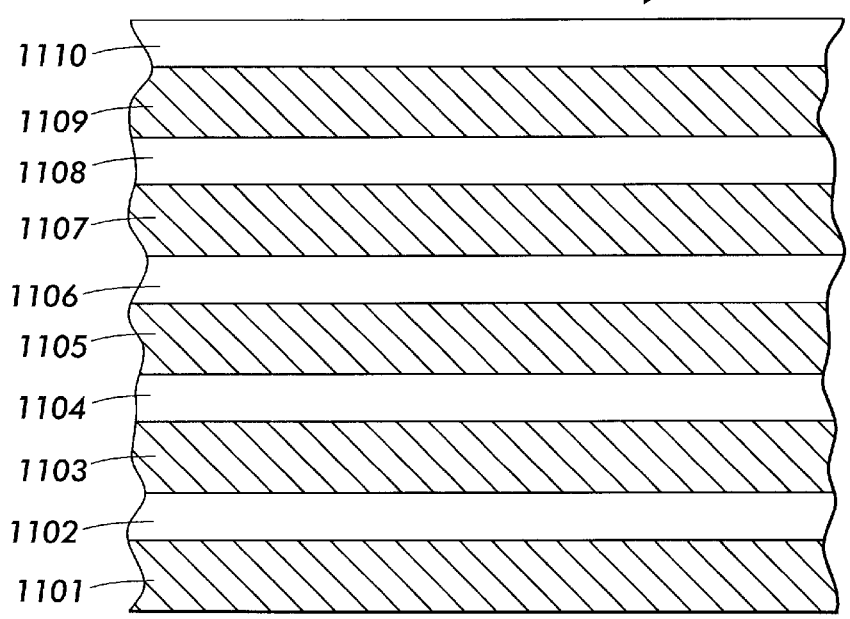
FIG. 11 shows a superlattice structure in accordance with the invention.
Figure 12:
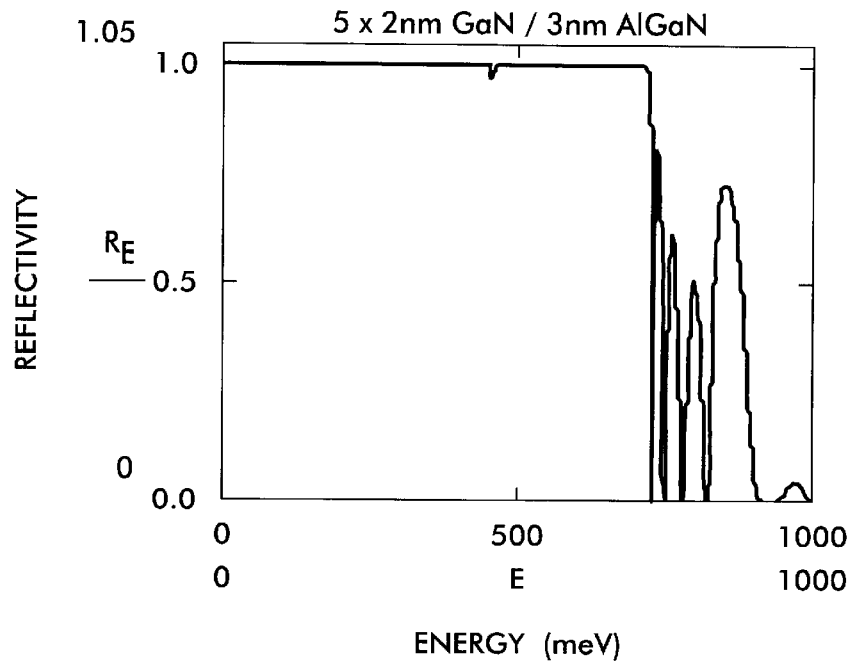
FIG. 12 shows an electron reflection spectrum for the superlattice in FIG. 11.

FIG. 11 shows 5 pair short period $Al_{0.2}Ga_{0.8}N$/GaN superlattice structure 1100 in an embodiment of distributed electron reflector 910b in accordance with the present invention. GaN layers 1102, 1104, 1106, 1108 and 1110 are selected to have a thickness of approximately 2 nm while AlGaN layers 1101, 1103, 1105, 1107, 1109 are selected to have a thickness of approximately 3 nm. The respective layer thicknesses are selected in part to prevent resonant tunneling by injected electrons at energies below about 700 meV while producing strong reflection up to 700 meV. For example, FIG. 12 shows the reflectivity versus electron energy for superlattice structure 1100 where zero meV corresponds to the conduction-band position in quantum wells in multiple-quantum well active region 120, and 300 meV to the conduction-band position in the barrier layers of multiple-quantum well region 120. 700 meV is taken as the conduction-band position in AlGaN barrier layers 1101, 1103, 1105, 1107 and 1109.

Figure 13:
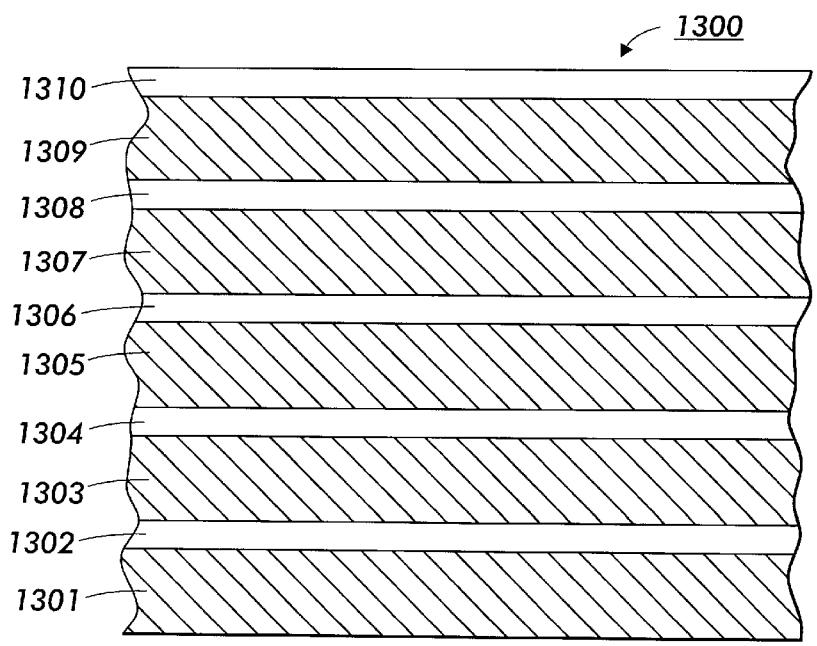
FIG. 13 shows a superlattice structure in accordance with the invention.

FIG. 13 shows 5 pair short period $InGaN/Al_{0.2}Ga_{0.8}N$ superlattice structure 1300 in an embodiment of a distributed electron reflector 910b in accordance with the present invention. Using InGaN instead of GaN allows improved p doping since the acceptor ionization energy is lower in InGaN. Furthermore, because of the high refractive index of InGaN, a combination of InGaN and AlGaN multiple quantum barrier has an average refractive index closer to that of GaN. Hence, structure 1300 is relatively neutral with respect to transverse waveguiding. In contrast, the typical 200 Å $Al_{0.2}Ga_{0.8}N$ bulk barrier layer has a negative influence on the quantum well active region optical confinement factor, Γ. Finally, InGaN/AlGaN short period superlattice structure 1300 provides a form of strain balancing which may suppress the formation of structural defects. Strain balancing occurs because InGaN experiences biaxial compression while AlGaN experiences biaxial tension in superlattice structure 1300.

Figure 14:
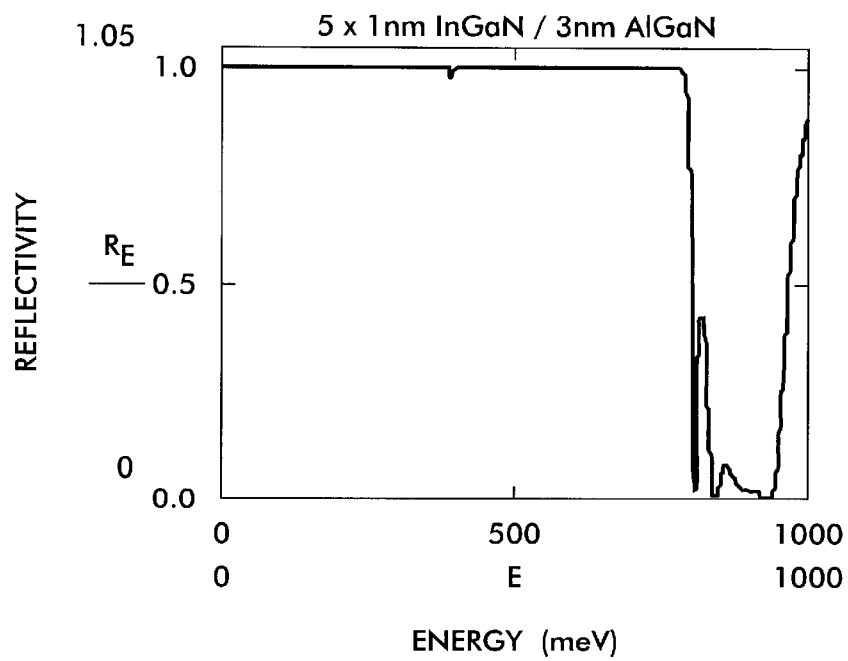
FIG. 14 shows an electron reflection spectrum for the superlattice in FIG. 13.

Low-bandgap InGaN layers 1302, 1304, 1306, 1308 and 1310 are selected to have a thickness of approximately 1 nm while AlGaN layers 1301, 1303, 1305, 1307 and 1309 layers are selected to have a thickness of approximately 3 nm. The respective layer thicknesses are selected in part to prevent resonant tunneling by injected electrons at energies below 800 meV while producing strong reflection up to 800 meV. For example, FIG. 14 shows the reflectivity versus electron energy for superlattice structure 1300 where zero meV corresponds to the conduction-band position in quantum wells in multiple-quantum well active region 120, and 300 meV to the conduction-band position in the barrier layers of multiple-quantum well region 120. 700 meV is taken as the conduction-band position in AlGaN barrier layers 1301, 1303, 1305, 1307 and 1309. FIG. 14 shows that the effective barrier height of superlattice structure 1300 is greater than the classical barrier height of 700 meV.

Figure 15:
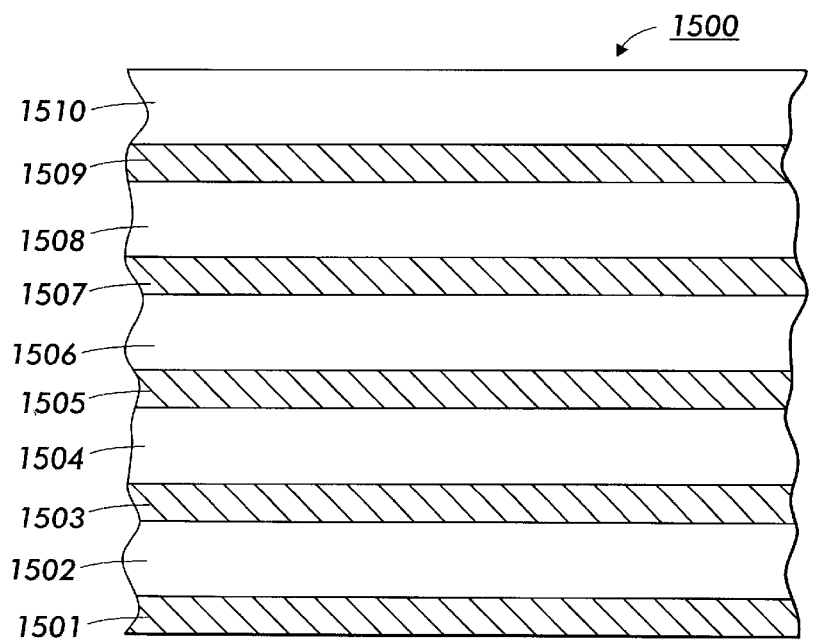
FIG. 15 shows a superlattice structure in accordance with the invention.
Figure 16:
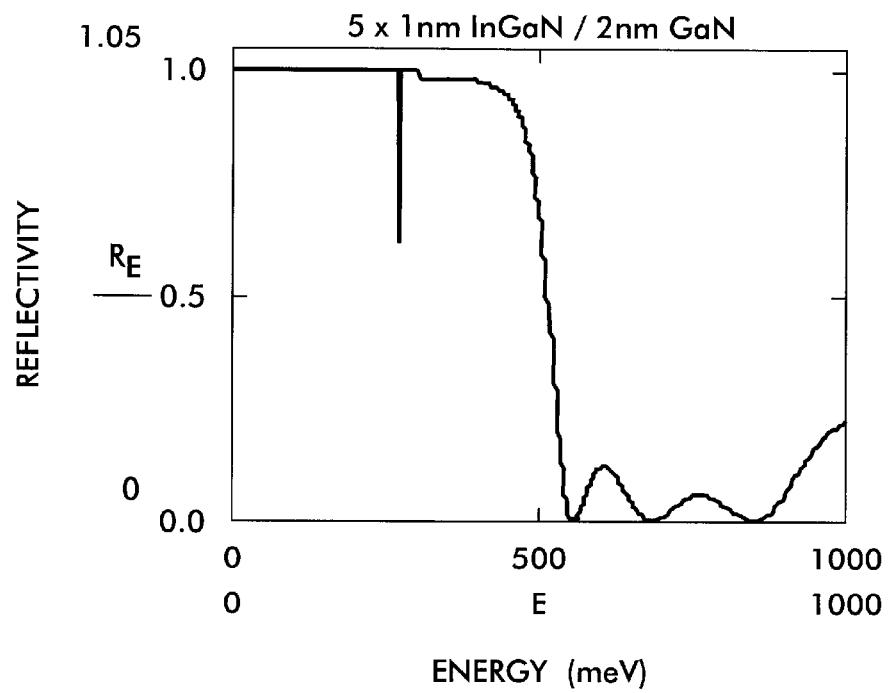
FIG. 16 shows an electron reflection spectrum for the superlattice in FIG. 15.

FIG. 15 shows 5 pair short period InGaN/GaN superlattice structure 1500 in an embodiment of a distributed electron reflector 910b in accordance with the present invention. Superlattice structure 1500 contains no high-bandgap AlGaN layers. GaN layers 1502, 1504, 1506, 1508 and 1510 are selected to have a thickness of approximately 2 nm while InGaN layers 1501, 1503, 1505, 1507 and 1509 are selected to have a thickness of approximately 1 nm. The respective layer thicknesses are selected in part to avoid resonant tunneling. For example, FIG. 16 shows shows the reflectivity versus electron energy for superlattice structure 1500 where zero meV corresponds to the conduction-band position in the quantum wells of multiple quantum well active region 120 and 300 meV to the conduction-band position in the barrier layers of multiple-quantum well active region 120. FIG. 16 shows the effective barrier height of superlattice structure 1500 is about 500 meV which is significantly greater than the classical barrier height of 300 meV. However, FIG. 16 shows that superlattice structure 1500 has a narrow transmission resonance at about 300 meV. Other than the narrow transmission resonance, superlattice structure 1500 provides a high reflectivity out to about 500 meV. In addition to the benefit of improved p doping and structural quality, an AlGaN-free multiple quantum barrier such as superlattice structure 1500 also provides a barrier which improves transverse waveguiding.

If InGaN layers 1302, 1304, 1306, 1308, and 1310 or 1502, 1504, 1506, 1508 and 1510 have a bandgap energy comparable to the multiple quantum well active region bandgap energy, superlattice structure 1300 or 1500, respectively, should be displaced from multiple quantum well region 120 by some minimum distance, $d_{min}$. This displacement inhibits tunneling of injected electrons from multiple quantum well active region 120 to InGaN layers 1302, 1304, 1306, 1308, and 1310 or 1502, 1504, 1506, 1508 and 1510 of superlattice structure 1300 or 1500, respectively. $d_{min}$ is limited by the requirement that the displacement not be so great that the electron wavefunction loses coherence before appreciable interaction occurs with superlattice structure 1300 or 1500. A typical range for $d_{min}$ is about 5–10 nm.

Figure 17:
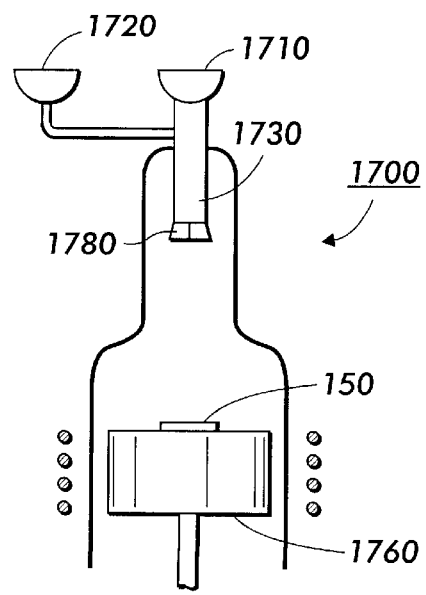
FIG. 17 shows a quartz reactor.

Table 1 in FIG. 18 shows the layers in sequence of deposition on sapphire substrate 150 for asymmetric waveguide nitride laser diode structure 400 along with the approximate deposition parameters for each layer. Organometallic flows are expressed in $\mu$moles/min, calculated based on complete saturation of the solid's (TMIn and $Cp_2Mg$) or liquid's (TMGa, TMAl, and TEGa) vapor by a hydrogen carrier gas. Asymmetric waveguide nitride laser diode structure 400 is made using metalorganic chemical vapor deposition (MOCVD). FIG. 17 shows quartz reactor cell 1700 has an inner diameter of about 80 mm to accommodate a single 5 cm sapphire substrate wafer. The reactor geometry is vertical flow with reactant gases being injected at the top of the reactor through line 1730, which is about 25 cm above sapphire wafer surface 1750. Diffuser structure 1780 is attached to line 1730. To avoid parasitic pre-reactions of the gaseous precursors, the ammonia flow is separated from the alkyl group-III precursors by passing through inlet 1720. The organometallic flow is introduced through inlet 1710. Sapphire substrate wafer 150 sits on rotating (about 10 rpm) SiC coated graphite susceptor 1760. Susceptor 1760 is inductively heated and temperature of susceptor 1760 is measured by a fiber-optic-coupled pyrometer (not shown) and controlled by a proportional-integral-derivative controller. The pressure in quartz reactor 1700 may be adjusted between about 50–740 Torr by means of a throttle valve (not shown) in the reactor exhaust line (not shown).

With reference to tables 1 and 2 in FIG. 18 and FIGS. 4 and 9 in the following description, sapphire ($Al_2O_3$) substrate 150 is either a C-face (0001) or A-face (11$\bar{2}$0) oriented sapphire. Sapphire substrate wafer 150 is obtained from Bicron Crystal Products of Washougal, Wash., with standard specifications including an epitaxial polish on one side and a 13 mil thickness. A heat clean is performed on sapphire substrate 150 for 600 seconds at a temperature of 1050° C. and pressure of 200 Torr with an $H_2$ flow of 10 slpm (standard liters per minute). GaN buffer layer 160 of 0.03 $\mu$m thickness is deposited at a temperature of 550° C., a pressure of 200 Torr with a TMGa (Trimethylgallium $(CH3)_3Ga$) flow of 34 $\mu$mole/min, $NH_3$ flow of 4 slpm and $H_2$ flow of 10 slpm for 120 sec. An undoped GaN layer (not shown in FIGS.) of 2 $\mu$m thickness is deposited at a temperature of 1125° C., a pressure of 700 Torr with a TMGa flow of 136 $\mu$mole/min, $NH_3$ flow of 4 slpm and $H_2$ flow of 10 slpm for 1200 sec.

GaN:Si lateral contact layer 155 of 5 $\mu$m thickness is deposited at a temperature of 1100° C., a pressure of 200 Torr with a TMGa flow of 136 $\mu$mole/min, $SiH_4$ flow of 0.0002 sccm (standard cubic centimeters per minute), $NH_3$ flow of 4 slpm and $H_2$ flow of 10 slpm for 3000 sec. $In_{0.03}Ga_{0.97}N$:Si defect reduction layer 156 of 0.1 $\mu$m thickness is deposited at a temperature of 800° C., a pressure of 200 Torr with a TEGa (triethylgallium $(C_2H_5)_3Ga$) flow of 12 $\mu$mole/min, a TMIn (trimethylindium $(CH_3)_3$In) flow of 6 $\mu$mole/min, an $SiH_4$ flow of 0.00002 sccm and an $NH_3$ flow of 5 slpm for 600 sec.

$Al_{0.07}Ga_{0.93}$N:Si cladding layer 131 of 0.7 $\mu$m thickness is deposited at a temperature of 1100° C., a pressure of 200 Torr, with a TMGa flow of 102 $\mu$mole/min, a TMAl (trimethylaluminum $(CH_3)_3$Al) flow of 10 $\mu$mole/min, an $SiH_4$ flow of 0.0002 sccm, an $NH_3$ flow of 4 slpm and an $H_2$ flow of 10 slpm for 800 sec. GaN:Si waveguide layer 116 of 0.1 $\mu$m thickness is deposited at a temperature of 1100° C., a pressure of 200 Torr with a TMGa flow of 34 $\mu$mole/min, an $SiH_4$ flow of 0.00002 sccm, an $NH_3$ flow of 4 slpm and an $H_2$ flow of 10 slpm for 300 sec.

The first $In_{0.12}Ga_{0.88}$N quantum well layer (not shown in FIGS.) of multiple quantum well active region 120 with 0.003 $\mu$m thickness is deposited at a temperature of 775° C., a pressure of 200 Torr, with a TEGa flow of 5 $\mu$mole/min, a TMIn flow of 24 $\mu$mole/min and an $NH_3$ flow of 4 slpm. The first $In_{0.02}Ga_{0.98}$N:Si barrier layer (not shown in FIGS.) is subsequently deposited on the first quantum well layer. $In_{0.02}Ga_{0.98}$N:Si barrier layer with 0.006 $\mu$m thickness is deposited at a temperature of 775° C., a pressure of 200 Torr, with a TEGa flow of 5 $\mu$mole/min, a TMIn flow of 3 $\mu$mole/min, an $SiH_4$ flow of 0.00001 sccm and an $NH_3$ flow of 5 slpm for 180 sec. This combination of quantum well layer and barrier layer is repeated three more times under the same conditions as can be seen from table 1 in FIG. 18. A fifth quantum well layer is then deposited as described in table 1. Subsequently, undoped GaN transition layer 429 with 0.005 $\mu$m thickness is deposited for 150 sec at a temperature that is varied from 775 to 900° C. while pressure is varied from 200 to 700 Torr. For GaN layer 429, TEGa flow is 5 $\mu$mole/min, $NH_3$ flow is 4 slpm and $H_2$ flow is 10 slpm for 150 sec.

$Al_{0.07}Ga_{0.93}$N:Mg cladding layer 130 with 0.5 $\mu$m thickness is deposited at a temperature of 900° C., a pressure of 700 Torr, with a TMGa flow rate of 34 $\mu$mole/min, a TMAl flow rate of 12 $\mu$mole/min, a $Cp_2Mg$ (biscyclopentadienylmagnesium $(C_2H_5)_2Mg$) flow rate of 0.5 $\mu$mole/min, an $NH_3$ flow rate of 4 slpm and an $H_2$ flow rate of 10 slpm for 2400 sec. GaN:Mg capping layer 140 with 0.1 $\mu$m thickness is deposited at a temperature of 900° C., a pressure of 700 Torr, with a TMGa flow rate of 34 $\mu$mole/min, a $Cp_2Mg$ flow rate of 0.5 $\mu$mole/min, an $NH_3$ flow rate of 4 slpm and an $H_2$ flow rate of 10 slpm for 300 sec.

With reference to table 2 in FIG. 18, and FIG. 9a, 5 pair period superlattice structure 910a may be deposited immediately on top of GaN transition layer 429 if desired. Expected conditions for depositing GaN:Mg layer 1051 with 0.002 $\mu$m thickness are a temperature of 900° C., a pressure of 700 Torr with a TMGa flow of 34 $\mu$mole/min, a $Cp_2Mg$ flow rate of 0.5 $\mu$mole/min, an $NH_3$ flow rate of 4 slpm and an $H_2$ flow rate of slpm for 6 sec. Subsequently a stop is implemented for 5 sec. without a change in temperature or pressure and an $NH_3$ flow rate of 4 slpm and an $H_2$ flow rate of 10 slpm. Expected conditions for depositing $Al_{0.25}Ga_{0.75}$N:Mg layer 1052 with a 0.002 $\mu$m thickness are a temperature of 900° C., a pressure of 700 Torr with a TMGa flow rate of 34 $\mu$mole/min, a TMAl flow rate of 60 $\mu$mole/min, a $Cp_2Mg$ flow rate of 0.5 $\mu$mole/min, an $NH_3$ flow rate of 4 slpm and an $H_2$ flow rate of slpm for 6 sec. Subsequently a stop is implemented for 5 sec. without a change in temperature or pressure and an $NH_3$ flow rate of 4 slpm and an $H_2$ flow rate of 10 slpm. The preceding sequence is repeated 4 times to make 5 pair period superlattice 910a.

With reference to table 2 in FIG. 18, and FIGS. 9a and 11, 5 pair short period $Al_{0.2}Ga_{0.8}$N/GaN superlattice structure 1100 for distributed electron reflector 910b may be may be deposited immediately on top of GaN transition layer 429 if desired. Expected conditions for depositing GaN:Mg layer 1101 with 0.002 µm thickness are a temperature of 900° C., a pressure of 700 Torr with a TMGa flow of 34 µmole/min, a Cp$_2$Mg flow rate of 0.5 µmole/min, an NH$_3$ flow rate of 4 slpm and an H$_2$ flow rate of slpm for 6 sec. Subsequently a stop is implemented for 5 sec. without a change in temperature or pressure and an NH$_3$ flow rate of 4 slpm and an H$_2$ flow rate of 10 slpm. Expected conditions for depositing Al$_{0.2}$Ga$_{0.8}$N:Mg layer 1102 with a 0.003 µm thickness are a temperature of 900° C., a pressure of 700 Torr with a TMGa flow rate of 34 µmole/min, a TMAl flow rate of 50 µmole/min, a Cp$_2$Mg flow rate of 0.5 µmole/min, an NH$_3$ flow rate of 4 slpm and an H$_2$ flow rate of 10 slpm for 9 sec. Subsequently a stop is implemented for 5 sec. without a change in temperature or pressure and an NH$_3$ flow rate of 4 slpm and an H$_2$ flow rate of 10 slpm. The preceding sequence is repeated 4 times to make 5 pair period superlattice 1100.

With reference to table 2 in FIG. 18, and FIGS. 9a and 13, 5 pair short period InGaN/AlGaN superlattice structure 1300 for distributed electron reflector 910b may be may be deposited immediately on top of GaN transition layer 429 if desired. Expected conditions for depositing In$_{0.1}$Ga$_{0.9}$N:Mg layer 1301 with 0.001 µm thickness are a temperature of 800° C., a pressure of 700 Torr with a TEGa flow of 10 µmole/min, a TMIn flow of 10 µmole/min, a Cp$_2$Mg flow rate of 0.2 µmole/min, an NH$_3$ flow rate of 5 slpm for 15 sec. Subsequently a stop is implemented for 10 sec. without a change in temperature or pressure and an NH$_3$ flow rate change from 5 to 4 slpm and an H$_2$ flow rate change from 0 to 10 slpm. Expected conditions for depositing Al$_{0.2}$Ga$_{0.8}$N:Mg layer 1302 with a 0.003 µm thickness are a temperature of 800° C., a pressure of 700 Torr with a TMGa flow rate of 34 µmole/min, a TMAl flow rate of 50 µmole/min, a Cp$_2$Mg flow rate of 0.5 µmole/min, an NH$_3$ flow rate of 4 slpm and an H$_2$ flow rate of 10 slpm for 9 sec. Subsequently a stop is implemented for 5 sec. without a change in temperature or pressure and an NH$_3$ flow rate change from 4 to 5 slpm and an H$_2$ flow rate change from 10 to 0 slpm. The preceding sequence is repeated 4 times to make 5 pair period superlattice 1300.

With reference to table 2 in FIG. 18, and FIGS. 9a and 15, 5 pair short period InGaN/GaN superlattice structure 1500 for distributed electron reflector 910b may be may be deposited immediately on top of GaN transition layer 429 if desired. Expected conditions for depositing In$_{0.1}$Ga$_{0.09}$N:Mg layer 1501 with 0.001 µm thickness are a temperature of 800° C., a pressure of 700 Torr with a TEGa flow of 10 µmole/min, a TMIn flow of 10 µmole/min, a Cp$_2$Mg flow rate of 0.1 µmole/min, and an NH$_3$ flow rate of 5 slpm for 15 sec. Subsequently a stop is implemented for 5 sec. without a change in temperature or pressure and an NH$_3$ flow rate of 5 slpm. Expected conditions for depositing GaN:Mg layer 1502 with a 0.002 µm thickness are a temperature of 800° C., a pressure of 700 Torr with a TEGa flow rate of 10 µmole/min, a Cp$_2$Mg flow rate of 0.1 µmole/min, and an NH$_3$ flow rate of 5 for 30 sec. Subsequently a stop is implemented for 5 sec. without a change in temperature or pressure and an NH$_3$ flow rate of 5 slpm. The preceding sequence is repeated 4 times to make 5 pair period superlattice 1500.

With reference to table 2 in FIG. 18 and FIG. 9a, high aluminum content tunnel barrier layer 910c may be deposited immediately on top of GaN transition layer 429 if desired. Conditions for depositing Al$_{0.2}$Ga$_{0.8}$N:Mg tunnel barrier layer 910c with 0.015 µm thickness are a temperature of 900° C., a pressure of 700 Torr with a TMGa flow rate of 34 µmole/min, a TMAl flow rate of 58 µmole/min, a Cp$_2$Mg flow rate of 0.5 µmole/min, an NH$_3$ flow rate of 4 slpm and an H$_2$ flow rate of 10 slpm for 40 sec.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for forming an asymmetric waveguide nitride laser diode comprising the operations of:

providing an active layer having a first and a second surface;

forming a transition layer in contact with said first surface of said active layer;

forming a p-cladding layer adjacent to said transition layer; and forming an N-type layer in contact with said second surface of said active layer.

2. The method of claim 1 further comprising the operation of:

placing a cap layer in contact with said p-cladding layer.

3. The method of claim 1 further comprising the operation of:

forming an n-cladding layer in contact with the n-type layer.

4. The method of claim 1 wherein the N-type layer is used as a waveguide.

5. The method of claim 1 wherein the transition layer is undoped.

* * * * *